United States Patent
Spitz et al.

(10) Patent No.: US 6,774,476 B2
(45) Date of Patent: Aug. 10, 2004

(54) POWER CONVERTER AND METHOD FOR PRODUCING THE SAME

(75) Inventors: Richard Spitz, Reutlingen (DE); Alfred Goerlach, Kusterdingen (DE); Alexander Wallrauch, Gomaringen (DE); Christoph Ruf, Eningen (DE); Peter Urbach, Reutlingen (DE); Uwe Knappenberger, Muehlacker (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 10/220,085

(22) PCT Filed: Feb. 21, 2001

(86) PCT No.: PCT/DE01/00666

§ 371 (c)(1),
(2), (4) Date: Dec. 4, 2002

(87) PCT Pub. No.: WO01/63671

PCT Pub. Date: Aug. 30, 2001

(65) Prior Publication Data

US 2003/0142480 A1 Jul. 31, 2003

(30) Foreign Application Priority Data

Feb. 26, 2000 (DE) .......................................... 100 09 171

(51) Int. Cl.[7] .............................................. H01L 23/02
(52) U.S. Cl. ...................................... 257/686; 257/725
(58) Field of Search ................................ 363/144, 147; 257/684–687, 690, 698, 701, 702, 706, 707, 723, 725

(56) References Cited

U.S. PATENT DOCUMENTS

| | | | |
|---|---|---|---|
| 4,642,671 A | | 2/1987 | Rohsler et al. |
| 5,995,379 A | * | 11/1999 | Kyougoku et al. ......... 361/803 |
| 6,087,716 A | * | 7/2000 | Ikeda ......................... 257/676 |
| 6,583,502 B2 | * | 6/2003 | Lee et al. .................... 257/686 |

FOREIGN PATENT DOCUMENTS

| | | |
|---|---|---|
| DE | 25 36 711 | 2/1978 |
| DE | 28 40 399 | 3/1980 |

OTHER PUBLICATIONS

Patent Abstracts of Japan vol. 009, No. 197 (E–335). Aug. 14, 1985 & JP 60 064458 ((Fujitsu KK), Apr. 13, 1985.

* cited by examiner

*Primary Examiner*—Matthew V. Nguyen
(74) *Attorney, Agent, or Firm*—Kenyon & Kenyon

(57) ABSTRACT

A power converter having at least two semiconductor substrates is provided. Each of the substrates has at least two contact surfaces, and the converter also has two thermally conductive mounting plates carrying the semiconductor substrates, which each have an electrical terminal, an attachment arrangement implemented on one of the mounting plates, and having at least one third electrical terminal, which is distinguished in that the mounting plates and the semiconductor substrates form stacks, the mounting plates receiving the semiconductor substrates between themselves, and an electrically and thermally conductive insert, which has at least the third terminal, is arranged between the semiconductor substrates.

34 Claims, 3 Drawing Sheets

POWER CONVERTER AND METHOD FOR PRODUCING THE SAME

FIELD OF THE INVENTION

The present invention relates to a power converter as well as the manufacture of a power converter.

BACKGROUND INFORMATION

Power converters of the type cited here are configured in greatly varying embodiments. They are used for converting or controlling electrical power. Power converters may be implemented as rectifiers, inverters, DC converters, and AC converters. Corresponding to these embodiments, the power converters have power converter valves, particularly diodes, thyristors, transistors, MOSFETs, IGBTs, and Triacs. Therefore, there are many types of controllable and non-controllable power converter valves. In the field of motor vehicles, power converters are used in particular as rectifiers which convert a periodic quantity provided by a generator into a zero-frequency quantity. Three-phase generators which provide multiple AC voltages phase-shifted in relation to one another are mainly used. The rectifier must correspondingly be implemented as a multipolar rectifier. These types of rectifiers have a corresponding number of individual, discrete power diodes which form the rectifier assembly. The rectifier assembly includes two terminal plates, one of which forms the positive voltage terminal and the other of which forms the negative voltage terminal. Both terminals are electrically insulated in relation to one another. The diodes and their housings may be pressed into the plates. As a rule, the negative terminal plate is attached to the end shield of the generator to produce a thermal and electrical contact. The positive terminal has a pin in order to be able to tap the voltage. This positive terminal is implemented as a heat sink in order to cool it. It may be situated in the airflow of the generator fan or also be thermally coupled to the end shield of the generator using a heat conducting film.

For the thermal conception of a single press-in diode and of the complete rectifier, two different operating cases must be considered. In normal operation, with an approximately constant load of the generator, a few tens of watts of power loss arise in the current path of each diode, which must be dissipated as heat via the negative and/or positive terminal (s). The second, load-dump case occurs in the event of sudden load shedding, after which the generator regulator requires a certain period of time in order to adjust the current of the exciter winding and regulate the generator voltage. In order to avoid high voltage peaks in the vehicle's electrical system during this period, the rectifier diodes may be implemented as Zener diodes, which are capable of absorbing the entire output of the generator for a short time.

The power losses arising in this case may be of the magnitude of multiple kilowatts. The heat then arising on the rectifier diodes cannot be dissipated via the heat sink, but rather is collected in the diode housing itself through an adequately dimensioned copper mass, which is therefore used as a heat buffer. Therefore, the power converters have been shown to be costly to construct and, in addition, relatively large, since—for a three-phase bridge rectifier—six individual diodes must be cooled using terminal plates having complicated constructions. In addition, a higher wiring outlay results for connecting the individual diodes and for electrically connecting the power converter to the electrical machine, for example, a generator.

SUMMARY

In contrast, a power converter of an example embodiment of the present invention provides a significant simplification of the construction as well as a reduction of the necessary space of the power converter, and a significant reduction in cost for its manufacture. In particular, thermal coupling is achieved between the two mounting plates, because the mounting plates used as an electrical terminal and the semiconductor substrates form a stack and a thermally and electrically conductive insert is positioned between the semiconductor substrates, which allows the electrical connection. It is therefore sufficient if one of the mounting plates is situated on a separate heat sink, for example on a generator end shield, using its attachment arrangement, in order to be able to dissipate the heat loss. A heat flow therefore results from the semiconductor substrate positioned near the one (upper) mounting plate to the other (lower) mounting plate, via the semiconductor substrate and the insert lying between them. Through the stacked arrangement of the semiconductor substrates between the mounting plates, both mounting plates are additionally electrically insulated in relation to one another, so that no further components or measures are necessary for this purpose. It has been shown that an additional heat sink for one of the mounting plates may be eliminated. Particularly for three-phase bridge power converters, the plus and minus terminals may be implemented on one of the mounting plates as a joint conductor bus above or below, respectively, the power converter valves and, in addition, additional wiring may be largely eliminated, since the insert arranged between the power converter valves is used as a terminal on the three-phase side.

The present invention is not restricted to rectifiers for use in three-phase generators. All other types of power converters may be implemented using it. If, for example, the insert is implemented as bipolar and the semiconductor substrate has two contact surfaces on its surface facing the insert, controllable power converter valves, particularly thyristors and transistors, MOSFETs, and IGBTs may also be used. The power converter according to the present invention is therefore usable in many electrical power conversion and control fields.

In order to implement the thermal and electrical conductivity of the mounting plates, in an example embodiment they may be produced from copper or at least include copper. They may be implemented in a plate shape, a flat surface particularly being provided in the mounting plate having the attachment arrangement, in order to provide a large thermal transfer surface to the end shield of the generator, so that the heat generated may be properly dissipated to the generator housing. Of course, it is also possible not to attach the power converter directly to the generator, but to another element used as a heat sink.

If the power converter is attached to the end shield of an electrical machine, particularly a generator, additional advantages result for the design of the machine: Due to the low overall dimensions of the power converter, enlarged air intake openings may be implemented on a housing, through which either the cooling, and therefore the efficiency of the machine, or the fan impeller of the machine, may be reduced in order to reduce the emission of noise. The power converter may also be attached to a liquid-cooled machine. Furthermore, high flexibility of the arrangement on a machine results due to the low overall dimensions of the power converter. The power converter may be arranged on a claw-pole machine, particularly a claw-pole generator of a motor vehicle, on the A or B side. Due to the small dimensions of the compact power converter, higher mechanical stability in relation to shock and vibration stresses also results, so that high and durable functional reliability is provided, particularly during its use in the motor vehicle.

A power converter, particularly of the type described above, may be manufactured easily and cost-effectively. During manufacturing, the components are layered on one another, an electrically conductive contact arrangement is applied in at least some regions between the components. During the layering of the components (mounting plates, semiconductor substrates, and insert) on one another, they May be laid on top of one another in sequence, the contact arrangement being provided between each of them. However, it is also possible for partial assemblies to be premanufactured. Thus, for example, it is possible to attach one of the semiconductor substrates onto each mounting plate using the contact arrangement. Both mounting plates are then assembled together, enclosing the insert, and connected to one another using the contact arrangement. The sequence may therefore be selected almost arbitrarily, the stacked arrangement of the components, however, always being selected.

In one exemplary embodiment, the contact arrangement may be a soldering paste or soldering foil. The soldering paste is applied onto at least one of the components which are to be joined. When using soldering paste, the paste may produce a certain adhesive effect, so that the parts lying on one another adhere to one another and therefore cannot slip in a subsequent heating process during assembly and are connected to one another in a precise alignment.

However, it is also possible to produce the contact arrangement through diffusion soldering or conductive gluing. For conductive gluing, for example, an adhesive may be used which is partially electrically conductive, i.e., the paste may contain electrically conductive particles.

In order to ease the joining of the components during preassembly, an electrically non-conductive spacer may be placed between the mounting plates. This spacer may be implemented such that an essentially closed housing is formed, in which the housing walls are formed by the mounting plates and the spacer. This spacer may be implemented as a partial assembly with the insert. The spacer may also be removed after the connection of the components to the contact arrangement. However, it may also remain in position until the free space existing between the mounting plates is filled up using a filling compound or injected using plastic. However, it may also remain after the free spaces between the mounting plates are filled up.

Particularly in multipolar power converters, in which multiple semiconductor stacks therefore lie next to one another, the inserts lying between two semiconductor substrates may be connected to one another. Terminal lugs which project over the edge of the housing may be provided. The lugs may be connected to one another at their ends. In this way, the assembly of the power converter is simplified. After the assembly is completed, the inserts, particularly their terminal lugs, may be separated from one another mechanically.

The components are pre-fixed, in particular during preassembly. For this purpose, pins or recesses may be used, for example, on the facing sides of the terminal plates, which work together with pins or recesses used on the spacer wherein the pins engage in the recesses. The spacer may thus additionally be used as a pre-fixing element, which—as described above—may be removed after assembly.

If—as just described—the free spaces are filled or injected, the lateral edges of the semiconductor substrate may be painted using a protective paint in order to protect the substrate from moisture and the filling compounds and/or plastics, which may be chemically aggressive.

DETAILED DESCRIPTION

Figure 1:
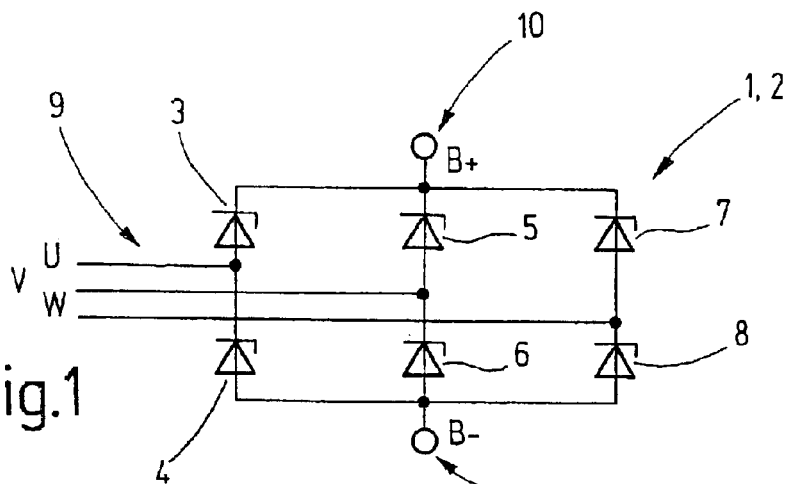
FIG. 1 is a wiring diagram of a power converter.

FIG. 1 illustrates a wiring diagram of a power converter 1, which is assumed to be rectifier 2 for the further considerations. Power converter 1 has at least two, in this case six, power converter valves 3 to 8, which are used in the case of rectifier 2 as diodes, in particular Zener diodes, as an example. The power converter illustrated in FIG. 1 is a six-pulse bridge power converter, which has a three-phase terminal 9 having three phase terminals U, V, and W. In addition, power converter 1 has a DC voltage terminal 10, which includes a positive terminal B+ and a negative terminal B−. In the exemplary embodiment illustrated, power converter 1 is used as a three-pole rectifier. However, power converter types having more or less poles may also be used.

In the following description, the construction of power converter 1 is described with reference to FIGS. 2 and 3. Identical parts or parts having the same function as in FIG. 1 are provided with identical reference numbers. DC terminal 10 is formed by two thermally and electrically conductive mounting plates 11 and 12, which are situated at a distance to one another. Mounting plate 11 forms the B+ terminal of DC terminal 10; mounting plate 12 forms the B− terminal of DC terminal 10. Mounting plates 11 and 12 are implemented in the exemplary embodiment as plates 13' and 14. Power converter valves 3 to 8 are configured as semiconductor substrates 15, each semiconductor substrate 15 having an upper and lower contact surface 16 and 17, respectively. Two semiconductor substrates 15 are stacked on one another between plates 13 and 14. An electrically and thermally conductive insert 18 is located between two semiconductor substrates 15 and has a terminal lug 19, which projects out of the region between both plates 13 and 14, as illustrated in FIG. 3. Therefore, two semiconductor substrates 15 arranged one behind the other form, together with plates 13 and 14 and insert 18, a stack 20 having multiple layers. If the power converter is implemented as a three-pole power converter, there are three stacks 20. Since semiconductor substrates 15 have electrical contact surfaces 16 and 17 on their top and bottom, three-phase terminal 9 and DC terminal 10 may be attached to semiconductor substrates 15. Therefore, each insert 18 forms one terminal U, V, W of three-phase terminal 9 and—as described above—each mounting plate 11 and 12 forms one terminal of DC terminal 10.

Figure 2:
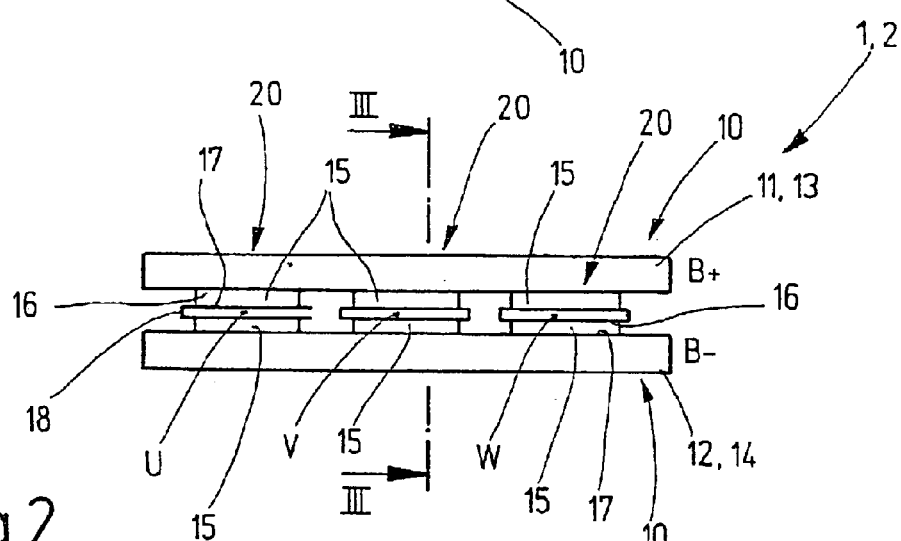
FIG. 2 is a schematic illustration showing construction of a power converter.
Figure 3:
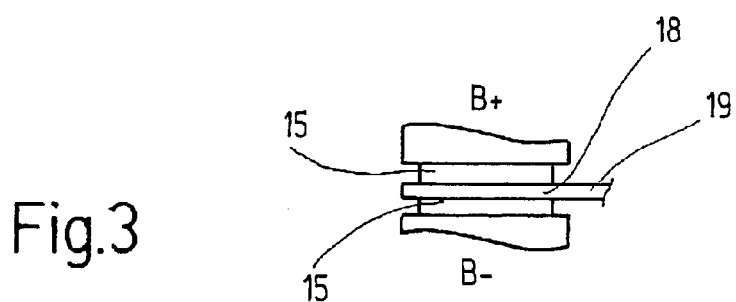
FIG. 3 is a sectional view of the power converter of FIG. 2.

As illustrated in FIGS. 2 and 3, semiconductor substrates 15 may have a flat design and do not have a housing. Various power converter valves may be used as semiconductor substrates 15—depending on the desired power converter function. In the case of rectifier 2, axial pn-diodes may be used, in which the p-n junction is essentially perpendicular to the plane of the drawing. One p or n layer of a semiconductor substrate 15 may press against terminal part 11 and the other n or p layer may press against insert 18, using their contact surfaces 16 and 17, respectively. Other semiconductor substrates, however, may also be used, such as planar components or, in the case of appropriate contact surfaces provided with solder depots, even integrated circuits. More than two contact surfaces 16 and 17 may also be provided. In this case, insert 18 may then include multiple terminal lugs 19, which are each assigned to one contact surface. For example, lower contact surface 17 of semiconductor substrate 15 may have multiple partial contact surfaces. With geometrical adjustments of three-phase terminal 9 and DC terminal 10, parallel circuits of multiple semiconductor substrates 15 are also possible for increasing current or expanding functionality.

Figure 4:
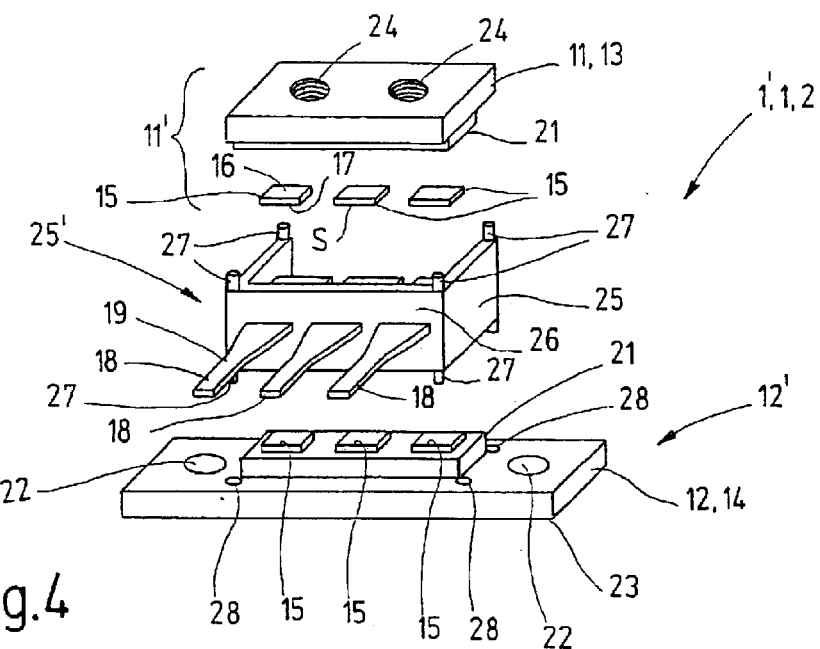
FIG. 4 is an exploded view of a first exemplary embodiment of a power converter arrangement.

As illustrated in FIG. 4, plates 13 and 14 may have a projection 21 on the sides facing one another, on which—in the assembled state—semiconductor substrates 15 come to rest. Mounting plate 12 additionally has an attachment arrangement wherein the assembled power converter 1 may be attached to a generator end shield. The attachment arrangement maybe implemented in the present exemplary embodiment using two holes 22, through which a bolt may be inserted. Holes 22 and/or the bolt may include threads. Therefore, it is possible to arrange mounting plate 12 having a bottom 23, which lies opposite projection 21, flat on the generator housing. For better heat transfer, a thermally conductive paste may be introduced between the generator housing and bottom 23.

Mounting plate 11 has at least one receptacle 24, two in this case, which may each receive one terminal element, for example a stud, so that a current tap may be attached to mounting plate 11. Alternatively, a terminal part, particularly a terminal plate, may also be soldered or welded onto mounting plate 11.

A spacer 25, which is made of or includes electrically insulating material, is also placeable between both mounting plates 11 and 12. In the present exemplary embodiment, inserts 18 and spacer 25 are implemented as assembled partial assembly 25'. For this purpose, spacer 25 has holes on one wall 26, through which terminal lugs 19 penetrate. Spacer 25 is implemented essentially U-shaped here, so that when power converter 1 is assembled, a housing is obtained which is open on only one side, so that a filling compound or a plastic, for example, may be introduced. The mounting plates therefore form the cover and bottom of the housing. Spacer 25 may additionally have pre-fixing elements 27, implemented as pins which engage in pre-fixing elements 29 implemented as recesses on mounting plates 11 and 12.

The assembly of power converter 1 may begin with the components mounted on mounting plate 12. An electrically conductive contact arrangement, for example soldering paste or soldering foil, may be applied onto projection 21 in the region of semiconductor substrates 15 to be attached. Subsequently, bottom contact surfaces 17 of semiconductor substrates 15 may be laid onto the contact arrangement. Subsequently, upper contact surfaces 16 may be coated with the contact arrangement. Partial assembly 25' is then pushed onto plate 12 such that pre-fixing elements 27 engage in pre-fixing elements 28. Subsequently, the free sides of inserts 18 are coated using the contact arrangement, at the points at which semiconductor substrates 15 come to rest. These substrates are subsequently laid on the contact arrangement on insert 18. After a subsequent coating of semiconductor substrates 15 using the contact arrangement, mounting plate 25 is finally put in place. A preassembled power converter assembly 1' may therefore be produced which is pre-fixed by the use of soldering paste and spacer 15. Subsequent heating of assembled power converter assembly 1' influences the soldering paste such that a permanent electrical connection is achieved between mounting plates 11, 12, semiconductor substrates 15, and inserts 19. The soldering temperatures may be monitored during the heating of power converter assembly 1'. If soldering paste or soldering foil is used, temperatures of more than 350° C. may be achieved under certain circumstances. Spacer 25 in particular may then be produced from a heat-resistant material, for example a ceramic or a high temperature plastic. In alternative joining methods, such as diffusion soldering or conductive gluing, lower processing temperatures arise. Therefore, spacer 25 may be configured as a plastic part.

As a variation of the assembly sequence, a two-part soldering process may also be used, in which lower semiconductor substrates 15 are first applied to projection 21 and connected to mounting plate 12 by soldering. Other semiconductor substrates 15 may be similarly connected to upper mounting plate 11. Therefore, premanufactured partial assemblies 11', 12' are produced, so that partial assemblies 25' may be used in a further assembly step and may be connected to remaining partial assemblies 11' and 12'. The benefits of this assembly sequence is that there is a lower number of components which must be handled during a soldering process, the testability of partial modules, and the possibility of applying different joining methods in both steps. Thus, for example, semiconductor substrates 15 may be attached to mounting plates 11 and 12 using a soldering paste. Inserts 18 may subsequently be attached to semiconductor substrates 15 by conductive gluing. Therefore, the critical thermal coupling of semiconductor substrates 15 onto mounting plates 11 and 12 may be performed via high temperature soldering, while the contact to inserts 18 may be produced using the conductive adhesive, which hardens without the high soldering temperatures. Therefore, spacer 25 may be made of plastic as an example.

A further assembly concept is described with reference to FIG. 5. Identical parts to those in FIG. 4 are provided with identical reference numbers. Therefore, only differences are discussed in the following description. Mounting plate 11 has lateral, removable extensions 29, each of which has a hole 30. For assembly, two guide pins 31 may be used, which may be inserted in holes 30 and 22. Guide pins 31 therefore form a pre-fixing element 28'. In order to be able to implement the housing open on only one side in power converter assembly 1' illustrated in FIG. 5, a housing part 32, provided as a clip which is implemented essentially U-shaped, may also be inserted in the intermediate space between both mounting plates 11 and 12. In order to simplify the assembly, inserts 18 may be enclosed in a leadframe 33, i.e., the free ends of terminal lugs 19 may be separably connected to one another. Leadframe 33 may have two legs 34, which lie essentially parallel to terminal lugs 19. Each leg 34 has a hole 35, through which guide pins 31 may penetrate. Guide pins 31 may be implemented as alignment pins having threads which may be screwed into threads of holes 22 and 30, holes 22 later being used—as described above—as attachment elements for attaching power converter 1 onto a generator.

Soldering foil parts 36, which produce the electrical connection of semiconductor substrates 15 to mounting plates 11 and 12 and inserts 18, may be used instead of the soldering paste described in connection with FIG. 4.

Figure 5:
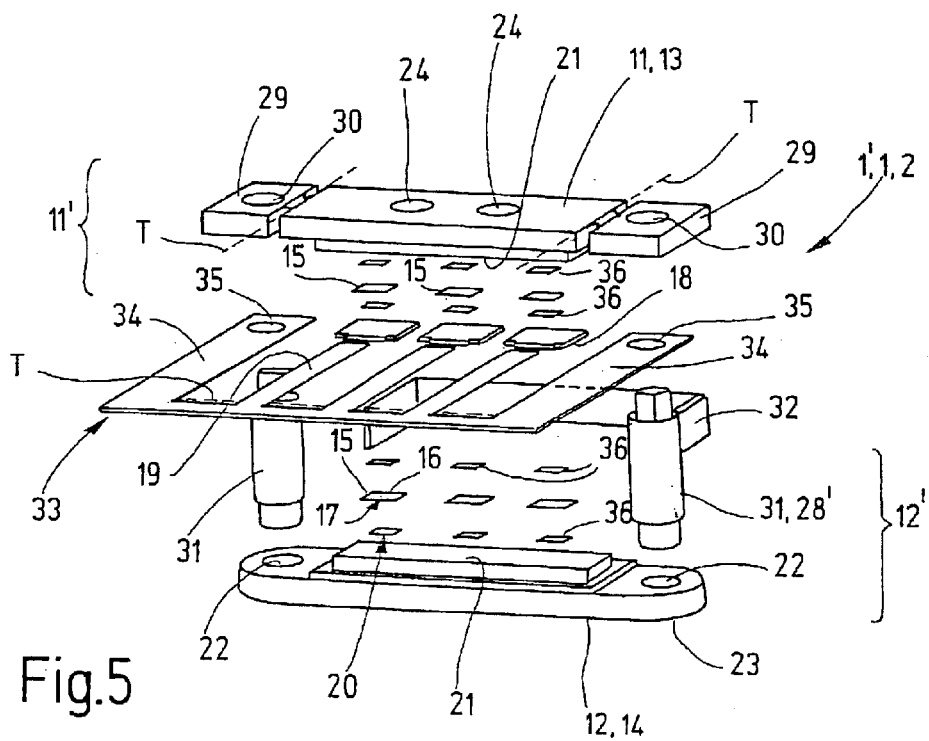
FIG. 5 is an exploded view of a second exemplary embodiment 5 of a power converter arrangement.

When power converter assembly 1' is assembled as illustrated in FIG. 5 and subsequently heated, the electrical contacts are produced by soldering foil 36. Subsequently, plastic may be poured or injected into the free regions existing between both mounting plates 11 and 12, wherein the housing part 32 prevents the filling compound or plastic from escaping unintendedly.

In an exemplary embodiment, lateral edges S of semiconductor substrates 15 may be painted in order to prevent semiconductor substrates 15 from being attacked by chemically aggressive filling compounds or plastics or penetrating moisture.

After power converter assembly 1' is fully assembled, extensions 29 and legs 34 may be separated on separation lines T. Guide pins 31 may thus be removed, so that holes 22 on mounting plate 11, 12 may be used for attaching power converter 1 onto the generator housing.

As an alternative to guide pins 31 used here, mounting plates 11, 12 and leadframe 33 may be riveted to one another for assembly, this riveted connection able to be punched out again after the soldering process. This method allows for large-scale manufacturing, since it avoids additional alignment pins and threaded bores and is compatible with riveting and stamping steps for conventional IC packaging.

Figure 6:
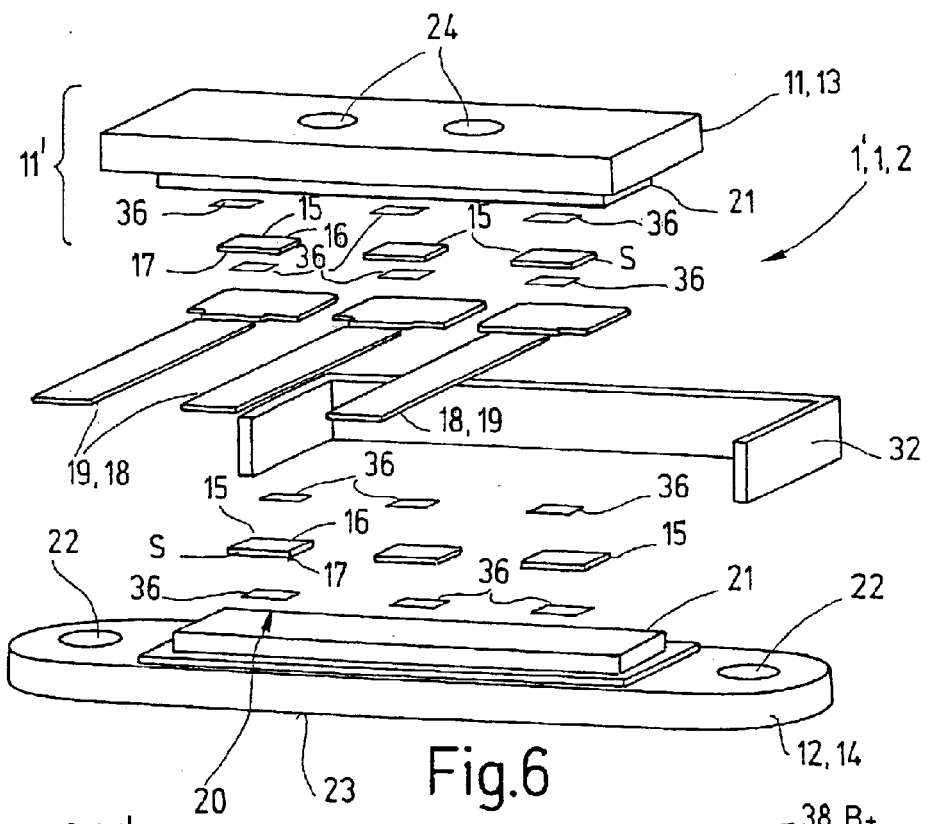
FIG. 6 is an exploded view of a third exemplary embodiment of a power converter arrangement.

In principle, the assembly steps described above may be performed without spacer 25 and/or guide pins 31, as illustrated in FIG. 6. For example, a corresponding soldering jig may be used, which holds mounting plates 11, 12 and inserts 19 in position during the fitting and soldering processes. In these variants, lateral, removable extensions 29 may be eliminated.

Figure 7:
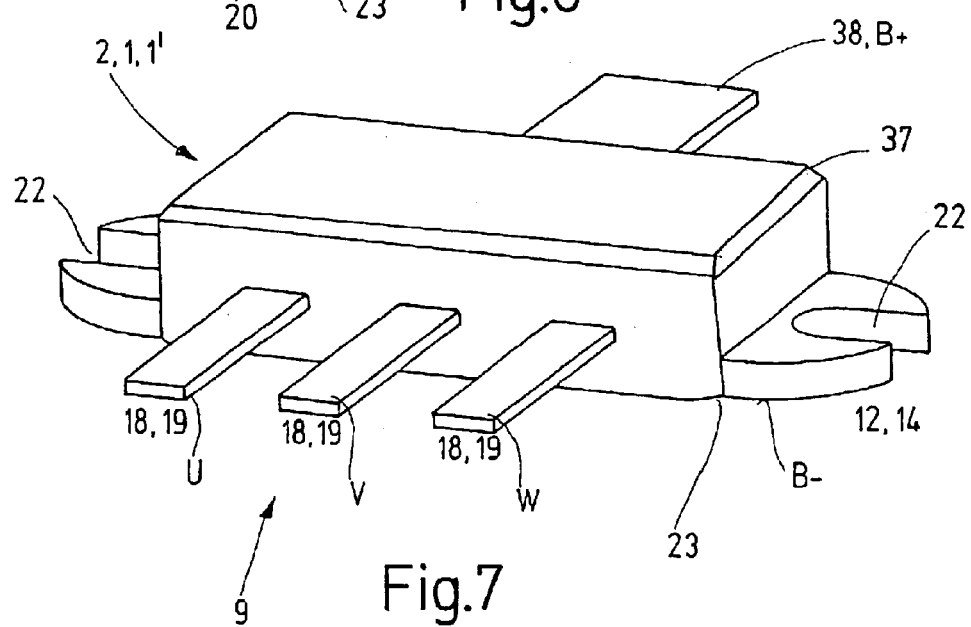
FIG. 7 shows a power converter provided with a plastic housing (molded housing).

In addition to the filling and/or injection methods described above using spacer 25 (FIG. 4) and a clip 32 (FIGS. 5 and 6), the packaging of the preassembled and/or completely assembled power converter assembly 1' may also be implemented using a molded housing 37 as illustrated in FIG. 7, completely dispensing with additional housing components. In molding processes used for this purpose, the component to be packaged, in this case power converter assembly 1', is inserted into a mold which includes a top and bottom, the top and bottom being sealed with respect to one another using high pressure. Through suitable geometry and/or inner contour of the mold and using appropriate sealing surfaces between the top and bottom and in relation to the surfaces of the component, a defined cavity remains in and around the component, into which a plastic compound may be injected. In this case, this plastic compound is injected into the cavity using a defined pressure and a defined temperature. The mold compound subsequently hardens in the mold within a short time. The mold may be opened and the finished packaged component may be ejected.

When using this molding method for packaging power converter assembly 1', implemented in the stack construction described, it is to be noted that semiconductor substrates 15 located between plates 11, 13 and 12, 14 may not be subjected to any mechanical strain, for example due to closing and sealing the mold. For this reason, the mold may be sealed directly only against lower plates 12, 14. Upper plates 11, 13 are therefore completely spray coated. Therefore, one of the cavities described above exists between these upper plates 11, 13 and the mold. The electrical B+terminal of power converter assembly 1' may be in the form of a laterally projecting terminal lug 38, additionally attached to upper plates 11, 13, as illustrated in FIG. 7, since this lug 38 may again be mechanically stressed at a sufficiently great distance from semiconductor substrates 15 and may therefore be sealed in relation to the mold. The stacked arrangement of power converter assembly 1' according to the present invention, has complete thermal dissipation toward the bottom to a separate heat sink via plates 12, 14, which is especially applicable for these packaging variants, since in this case upper plates 11, 13 are no longer accessible or are only poorly accessible for cooling measures.

For the assembly sequences described in connection with FIGS. 4 to 7, it is not necessary to implement all terminal lugs 19 on one side. Rather, the direction of each terminal lug 19 may be selected as desired. In particular, it may be necessary, due to the spatial arrangement of electrical terminals on the generator, for two terminal lugs 19 to project on the same side and third terminal lug 19 to project on the opposite side.

What is claimed is:

1. A power converter comprising:
   at least two semiconductor substrates, each of the substrates having at least two contact surfaces;
   two thermally conductive mounting plates configured to support the semiconductor substrates, the mounting plates each having an electrical terminal;
   an attachment arrangement implemented on one of the mounting plates; and
   an electrically and thermally conductive insert having at least one third electrical terminal;
   wherein the mounting plates, the semiconductor substrates, and the conductive insert form a stack, the mounting plates configured to receive the semiconductor substrates between the plates and being insulated with respect to one another by the semiconductor substrates, and wherein the electrically and thermally conductive insert is situated between the semiconductor substrates, and wherein the semiconductor substrates are power converter valves of the same type, and the semiconductor substrates are connected to the conductive insert via an electrically conductive contact means.

2. The power converter according to claim 1, wherein the attachment arrangement is configured to attach the power converter onto an electrical machine.

3. The power converter according to claim 1, wherein multiple stacks of the semiconductor substrates are situated next to one another between the mounting plates.

4. The power converter according to claim 1, wherein the mounting plates are one of entirely made from copper and partially made from copper.

5. The power converter according to claim 1, wherein the semiconductor substrates of the two adjacent stacks are configured as one of individual chips and a contiguous chip.

6. The power converter according to claim 1, wherein the mounting plates have an essentially plate-shaped configuration.

7. A method for manufacturing a power converter having at least two semiconductor substrates of the same type, each of the at least two semiconductor substrates having at least two contact surfaces; two thermally conductive mounting plates supporting the semiconductor substrates, which each have an electrical terminal; an attachment arrangement implemented on one of the mounting plates; and a conductive insert having at least one third electrical terminal, comprising:

laying the following elements on top of one another one of the at least two thermally conductive mounting plates, one of the at least two semiconductor substrates, the insert, another of the at least two semiconductor substrates, and another of the two thermally conductive mounting plates; and introducing an electrically conductive contact arrangement in at least some regions between at least one of the semiconductor substrates and the conductive insert.

8. The method according to claim 7, wherein one of a soldering paste and a soldering foil is used as the contact arrangement.

9. The method according to claim 7, wherein the contact arrangement is produced through one of diffusion soldering and conductive gluing.

10. The method according to claim 7, further comprising: heating an assembled power converter.

11. The method according to claim 7, further comprising:
attaching one of the semiconductor substrates onto each of the two mounting plates using the contact arrangement; and
connecting the semiconductor substrate to the insert using the contact arrangement.

12. The method according to claim 7, further comprising:
placing an electrically non-conductive spacer between the two mounting plates.

13. The method according to claim 12, wherein the spacer and the insert form a separable assembly.

14. The method according to claim 7, wherein multiple semiconductor substrates are positioned next to one another between the two mounting plates.

15. The method according to claim 7, wherein a plurality of inserts are provided, and wherein the inserts are connected to one another during assembly and are only separated from one another after the assembly of the power converter.

16. The method according to claim 7, further comprising:
filling up a free region existing between the two mounting plates using a casting compound.

17. The method according to claim 7, further comprising:
pre-fixing at least some elements of the power converter using pre-fixing elements.

18. The method according to claim 17, further comprising:
removing the pre-fixing elements after assembly.

19. The method according to claim 16, further comprising:
painting lateral edges of the semiconductor substrates before introduction of the casting compound.

20. The method according to claim 7, wherein plastic is injected into a free region existing between the two mounting plates.

21. The method according to claim 7, further comprising:
at least partially extrusion-coating the power converter as a preassembled power converter using plastic.

22. The method according to claim 21, wherein the extrusion-coating of the power converter assembly comprises:
placing the power converter assembly into a mold; and
injecting the plastic through an opening in the mold.

23. The method according to claim 22, wherein the mold is configured such that a three-phase terminal, a DC terminal; the attachment arrangement configured on one of the mounting plates, and a bottom of one of the mounting plates project out of the mold.

24. The method according to claim 23, wherein another of the two mounting plates is situated completely inside the mold.

25. The method according to claim 24, further comprising:
attaching a terminal lug, which projects out of the mold, to the another of the two mounting plates before the injection of the plastic into the mold.

26. The power converter according to claim 1, wherein the semiconductor substrates are diodes.

27. The power converter according to claim 1, wherein the semiconductor substrates are zener diodes.

28. The power converter according to claim 1, wherein the semiconductor substrates are thyristors.

29. The power converter according to claim 1, wherein the semiconductor substrates are MOSFETs.

30. The power converter according to claim 1, wherein the semiconductor substrates are IGBTs.

31. The power converter according to claim 1, further comprising:
an electrically non-conductive spacer arranged between the two thermally conductive mounting plates.

32. The power converter according to claim 31, wherein the electrically non-conductive spacer is u-shaped.

33. The power converter according to claim 31, wherein the electrically non-conductive spacer includes at least one of a ceramic and a high temperature plastic.

34. The power converter according to claim 1, wherein the electrically and thermally conductive insert includes a terminal lug that projects out of a region between the two thermally conductive mounting plates.

* * * * *